(12) United States Patent
Sheth et al.

(10) Patent No.: US 12,394,973 B2
(45) Date of Patent: Aug. 19, 2025

(54) APPARATUS AND METHOD OF DETECTING AND CLASSIFYING FAULTS IN CIRCUIT INTERRUPTER IN MICROSECONDS

(71) Applicant: EATON INTELLIGENT POWER LIMITED, Dublin (IE)

(72) Inventors: Tejal Rohan Sheth, Pune (IN); Prasad Arvind Venikar, Pune (IN); Sapana Darekar, Pune (IN); Swapnil Dhavan, Pune (IN); Machiraju Anurag Swamy, Secunderabad (IN); Ming Wu, Allison Park, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 264 days.

(21) Appl. No.: 18/210,827

(22) Filed: Jun. 16, 2023

(65) Prior Publication Data

US 2024/0421585 A1 Dec. 19, 2024

(51) Int. Cl.
| | |
|---|---|
| *H02H 1/00* | (2006.01) |
| *H02H 1/04* | (2006.01) |
| *H02H 3/04* | (2006.01) |
| *H02H 3/093* | (2006.01) |
| *H02H 3/28* | (2006.01) |
| *H02H 3/44* | (2006.01) |

(52) U.S. Cl.
CPC ........ *H02H 3/0935* (2013.01); *H02H 1/0015* (2013.01); *H02H 1/0053* (2013.01); *H02H 1/043* (2013.01); *H02H 3/042* (2013.01); *H02H 3/28* (2013.01); *H02H 3/44* (2013.01)

(58) Field of Classification Search
CPC .. H02H 1/0015; H02H 1/0023; H02H 1/0076; H02H 1/0061; H02H 3/08; H02H 3/093; H02H 3/335; H01H 71/04; H01H 71/123; H01H 71/68; H01H 71/1027; H01H 9/54; H01H 9/50; H01H 9/542
See application file for complete search history.

(56) References Cited

U.S. PATENT DOCUMENTS

2011/0116196 A1* 5/2011 Kellis ................. H02H 7/0816
361/30

* cited by examiner

*Primary Examiner* — Bryan R Perez
(74) *Attorney, Agent, or Firm* — Eckert Seamans Cherin & Mellott, LLC (57) ABSTRACT

A circuit interrupter is structured to electrically connect between a power source and a load. The circuit interrupter includes: separable contacts; an actuator coupled to the separable contacts and structured to open or close the separable contacts; a current sensor structured to sense current flowing through the circuit interrupter to the load; a communication module communicatively coupled to at least one of a cloud server and a user device and structured to transmit and receive data; and a controller coupled to the sensor, the actuator, and the communication module, the controller comprising at least one of a fault detector and a look-up table, the fault detector structured to detect and classify a fault, the look-up table comprising at least reference data associated with previous normal cycles, the reference data including at least power factors, closing angle ranges and fault classification categories.

20 Claims, 8 Drawing Sheets

APPARATUS AND METHOD OF DETECTING AND CLASSIFYING FAULTS IN CIRCUIT INTERRUPTER IN MICROSECONDS

FIELD OF THE INVENTION

The disclosed concept relates generally to an apparatus and method of circuit protection, and in particular, to an apparatus and method of detecting and classifying faults in circuit interrupters in microseconds.

BACKGROUND OF THE INVENTION

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Conventional circuit interrupters for residential applications can detect fault events and issue a trip command in an order of a few milliseconds (ms), e.g., without limitation, approximately from 8 ms to 16 ms based on the calibration setting, amperage of the thermal magnetic circuit interrupter or electronic circuit interrupter. They also include an algorithm that is based on locus curve or wavelet waveforms for fault detection. Such an algorithm requires a great deal computing and processing power, thereby resulting in a prolonged time (e.g., without limitation, approximately between 200 to 500 microseconds (μs)) for fault detection. Such a prolonged fault detection time can impact the health of the circuit interrupter and damage contacts and/or the peripherals thereof since current can rise to dangerously high amplitudes.

There is a need for improved fault detection mechanism in circuit interrupters.

SUMMARY OF THE INVENTION

These needs, and others, are met by a circuit structured to electrically connect between a power source and a load. The circuit interrupter includes: separable contacts; an actuator coupled to the separable contacts and structured to open or close the separable contacts; a current sensor structured to sense current flowing through the circuit interrupter to the load; a communication module communicatively coupled to at least one of a cloud server and a user device and structured to transmit and receive data; and a controller coupled to the sensor, the actuator, and the communication module, the controller comprising at least one of a fault detector and a look-up table, the fault detector structured to detect and classify a fault, the look-up table comprising at least reference data associated with previous normal cycles, the reference data including at least power factors, closing angle ranges and fault classification categories.

Another example embodiment includes a method of detecting and classifying a fault in microseconds. The method includes: providing a circuit interrupter that is structured to electrically connect between a power source and a load and comprises: separable contacts, an actuator coupled to the separable contacts and structured to open or close the separable contacts, a current sensor structured to sense current flowing through the circuit interrupter to the load, a communication module communicatively coupled to at least one of a cloud server and a user device and structured to transmit and receive data; and a controller coupled to the sensor, the actuator, and the communication module, the controller comprising at least one of a fault detector and a look-up table, the fault detector structured to detect and classify a fault, the look-up table comprising at least reference data associated with previous normal cycles, the reference data including at least power factors, closing angle ranges and fault classification categories; sensing the current flowing through the circuit interrupter to the load; and detecting and classifying a fault based at least in part on a signal from the sensor.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE INVENTION

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

The example embodiments provide a fault detector and method for detecting and classifying a fault and causing fast tripping of a current protection device within microseconds upon detecting and classifying the fault. For the classification, the fault detector differentiates a normal condition, a fault, an overload and a transient (e.g., without limitation, an inrush current) using existing current sensors (e.g., without limitation, a Rogowski coil) and an established algorithm such as, e.g., without limitation, a 3-sample Mann Morrison algorithm to electrical signals that may include transients. Although the 3-sample algorithm is applicable only to noise-free steady state estimations requiring lower sampling frequencies (e.g., without limitation, KHz frequency) and would yield erroneous results if applied to transients requiring a high sampling frequency (e.g., without limitation, MHz), the fault detector effectively uses the 3-sample algorithm by utilizing an appropriate filter (e.g., without limitation, a moving average filter) such that the signal information is retained in data sampled at a MHz frequency range and still applicable for the fault classification. As such, the fault detector advantageously detects and classifies a fault within microseconds, unlike conventional current protection systems that use kHz sampling frequencies for fault detection, and clears faults in milliseconds. By significantly reducing fault detection and clearance time, the fault detector of the disclosed concept improves safety and reduces damage to the current protection device and the peripherals thereof. Further, the fault detector utilizes steady-state data (e.g., without limitation, a power factor, a closing angle, etc.) detected from previous cycles together with a look-up table that includes the steady-state data in order to determine the fault or transient categories. The steady-state data are analyzed along with cycle-to-cycle RMS amplitude variations for classification. In addition, machine learning may be utilized for the classification. Additionally, the fault detector is compatible with edge devices irrespective of complexity of system data and/or fault events because it advantageously mitigates system noises, that typically result in distortion and wasted processing powers. Finally, the fault detector can be implemented for not only residential circuit interrupters, but also commercial and industrial range circuit breakers by using different look-up tables and thresholds for fault parameters as appropriate without departing from the scope of the disclosed concept.

Figure 1:
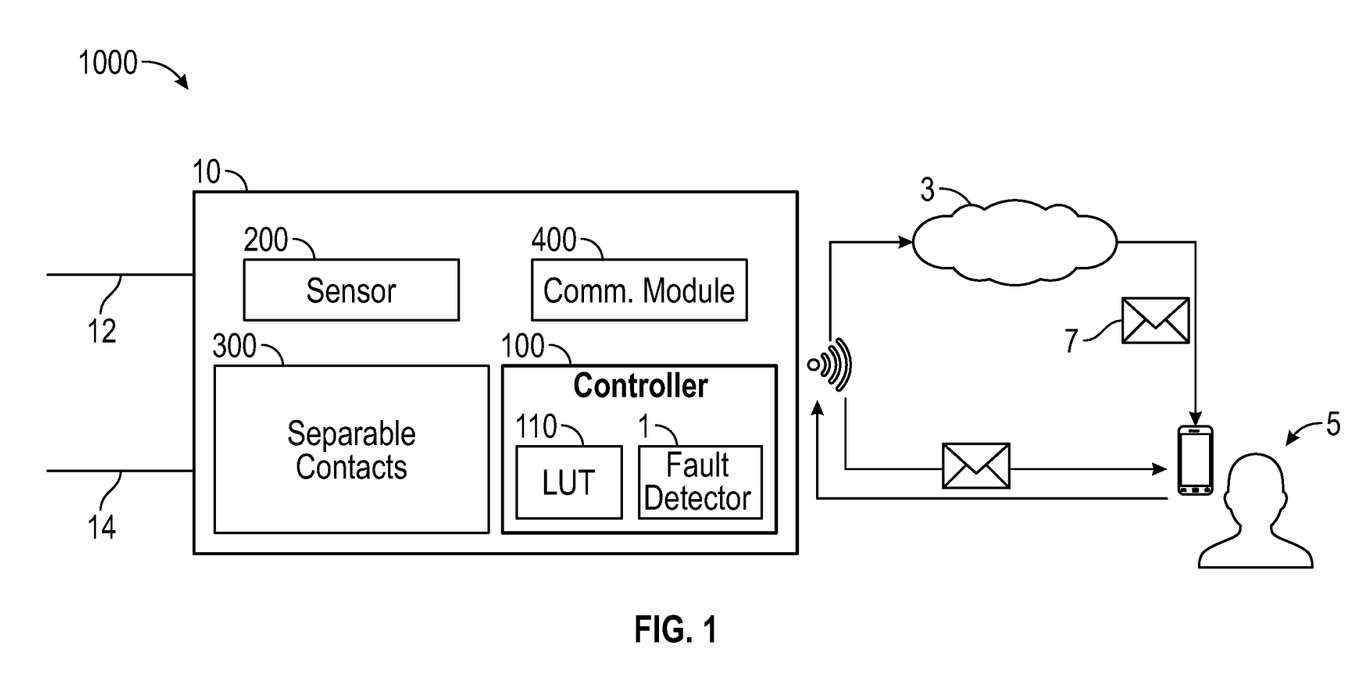
FIG. 1 is a diagram of a power distribution system in accordance with an example embodiment of the disclosed concept.
Figure 2:
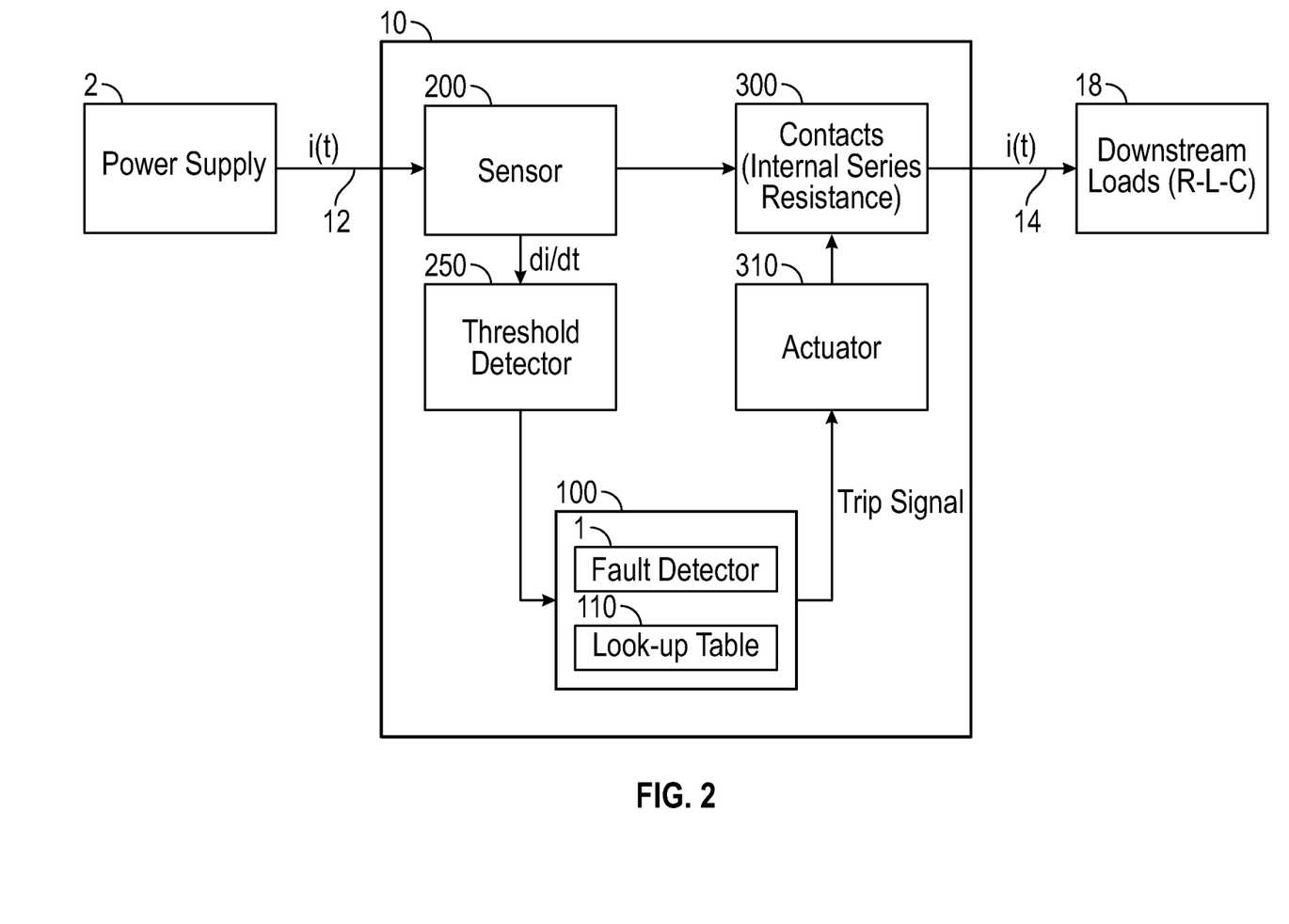
FIG. 2 is a block diagram of a circuit interrupter including a fault detector in accordance with an example embodiment of the disclosed concept.
Figure 3:
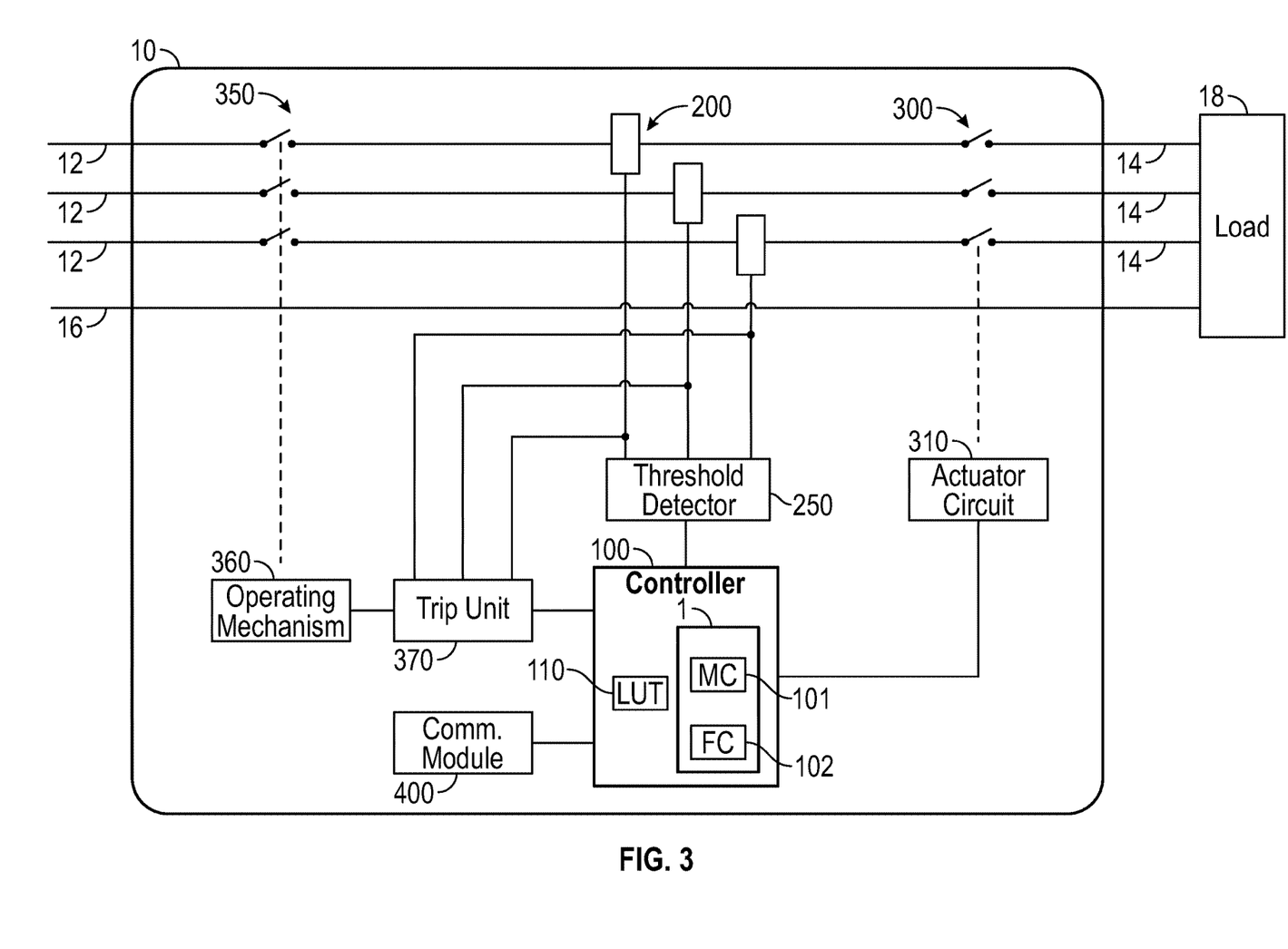
FIG. 3 is a partial schematic and block diagram of the circuit interrupter of FIGS. 1-2.

FIGS. 1-3 illustrate an exemplary circuit interrupter 10 for use in a power distribution system. FIG. 1 is a diagram of a power distribution system 1000 in accordance with a non-limiting, example embodiment of the disclosed concept. The power distribution system 1000 includes a circuit interrupter 10 (e.g., without limitation, a smart circuit breaker) coupled to a power source (e.g., without limitation, the power supply 2 as shown in FIG. 2) via a line conductor 12 and one or more downstream loads (e.g., without limitation, the loads 18 as shown in FIGS. 2 and 3) via a load conductor 14. The circuit interrupter 10 may be coupled to an edge device (e.g., without limitation, a gateway device, a router, etc.) in a wired or wireless connection. The circuit interrupter 10 may also be communicatively coupled to a cloud server 3 and/or a user device 5 via a wireless high-speed communications technology (e.g., LTE, A-LTE, etc.). The circuit interrupter 10 may include at least a controller 100, a sensor 200, separable contacts 300 and a communication module 400. The sensor 200 is coupled to the controller 100 and may include current sensors to sense current flowing through the circuit interrupter 10, voltage sensors to sense input and output voltages, and/or other appropriate sensors (e.g., temperature sensors). It is structured to transmit electrical signals to the controller 100. The electrical signals include data such as a current slope (di/dt), amplitudes, time durations and so forth. The contacts 300 may include, e.g., without limitation, primary separable contacts, secondary separable contacts, etc. structured to open or close by respective actuators. The communication module 400 is coupled to the controller 100, the cloud server 3, the user device 5 and/or an edge device (not shown), and structured to receive and/or transmit the data. While FIG. 1 does not show, the circuit interrupter 10 may also include other components such as a threshold detector 250 structured to determine if the current slope (di/dt) of a change in current or a current slope has reached or exceeded a minimum fault threshold and transmit a signal indicative of such determination to the controller 100.

The controller 100 may be, for example and without limitation, a microprocessor, a microcontroller, or some other suitable processing device or circuitry. It may include memory, which can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. The controller 100 may be coupled to at least the sensor 200 (e.g., without limitation, via the threshold detector 250), actuators 310 as shown in FIGS. 2 and 3, and the communication module 400.

The controller 100 may include at least one of a fault detector 1 and a look-up table 110. The fault detector 1 is structured to detect and classify a fault. The look-up table 110 may include at least reference data associated with previous normal cycles, the reference data including at least power factors, closing angle ranges and fault classification categories. An exemplary look-up table 110 is illustrated in Table 2. The previous normal cycles refer to previous healthy cycles without a fault event. The fault detector 1 detects and classifies a fault based at least in part on the reference data. The fault detector 1 may include a main circuit protector 101 and a fault classifier 102 as shown in FIG. 3. The main circuit protector 101 may be a conventional current protection circuit structured to execute self-tests, perform circuit protection upon detection of a fault (e.g., without limitation, arc fault, ground fault, etc.), and collect the reference data from previous and present AC cycles that are healthy (e.g., without a fault). The main circuit protector 101 may store the reference data in memory and continuously update the look-up table with the reference data for future fault determination. The operational steps of the main circuit protector 101 is discussed further with reference to FIG. 6.

The fault classifier 1 is structured to be triggered upon detecting a fault, the detecting including sensing by the sensor 200 that a current slope (di/dt) has reached or exceeded a minimum fault threshold. Optionally, the threshold detector 250 (as shown in FIGS. 2 and 3) may transmit an interrupt signal to the fault classifier 102 upon receiving a signal from the sensor 200 that the current slope (di/dt) has reached or exceeded the minimum fault threshold. The minimum fault threshold for the current slope may be, e.g., without limitation, 0.5 A/μs. A minimum fault threshold for current RMS value may be, e.g., without limitation, 40 A. If the current remains above the minimum fault threshold, the interrupt signal may be low. If the current is below the minimum fault threshold, the interrupt signal may be high. The interrupt routine may execute, e.g., without limitation, 32 times in one AC cycle based on the interrupt signal. The interrupt routine first increments an interrupt count and calculates a closing angle. It then samples ADC (analog to digital converter) data and store current and voltage waveform instantaneous values.

For classifying the fault, the fault classifier 102 is further structured to collect a plurality of samples over a first period upon being triggered, filter sample data of the plurality of samples using a moving average, determine root mean square (RMS) values for voltage and current using a 3-sample algorithm on filtered sample data, calculate an average current slope of the plurality of samples over the first period, and determine a fault classification category for the detected fault. The plurality of samples may include, e.g., without limitation, 15 samples collected at every 1 μs. The first period may be, e.g., without limitation, approximately 15 μs. For determining a fault classification category, the fault classifier 102 is further structured to determine a fault power factor from a previous cycle (e.g., without limitation, a previous cycle immediately preceding the triggering of the fault classifier 102) and a fault closing angle based at least in part on the triggering of the fault classifier 102 and the filtered sample data, and select a fault classification category from the look-up table 110. The fault classifier 102 determines a closing angle range based on the reference data collected using a high frequency data sampling. A high frequency data sampling collects a plurality of samples (e.g., without limitation, 15, 32, etc.) in one AC cycle and the sampled data are filtered to mean out any noises using a moving average filter (e.g., without limitation, a simple moving average). Since noise is a zero-mean signal, using the moving average filter reduces any measurement errors. Each sample during the one AC cycle is numbered and the sample number is stored in memory. The fault detector 1 estimates the closing angle based at least in part on the high frequency sample data. For example, for a waveform spanning over 360°, 32 samples may be distributed over 360°, and thus each sample corresponds to 11.25°. As such, the first sample (numbered as 1) may start at 0° and end at 11.25°, the second sample (numbered as 2) may start at immediately after 11.25° and end at 22.5°, and so forth. Thus, if the fault classifier 102 is triggered after four healthy samples, then the closing angle range for the fault may be 45 to) 56.25° (45°+11.25°.

For selecting a fault classification category, the fault classifier 102 is further structured to determine if the fault includes an overlap between current signatures (e.g., without limitation, RMS values, average slopes, frequency spectra, etc.) of a short circuit, an overload and an inrush current. Upon determining if the fault includes an overlap, the fault classifier 102 may classify the fault in multi-stages, e.g., without limitation, 3 stages.

Figure 4A:
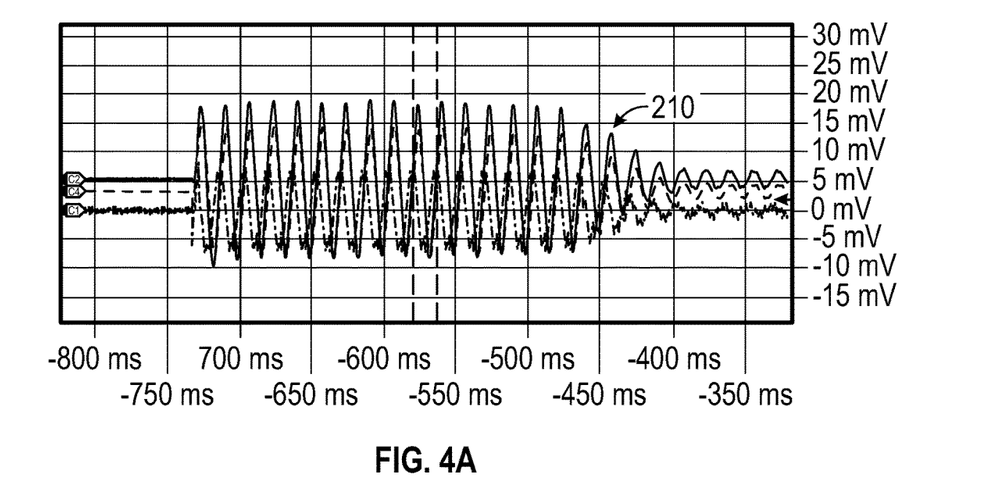
FIGS. 4A-C illustrate graphs depicting an inrush current in accordance with an example embodiment of the disclosed concept.
Figure 4B:
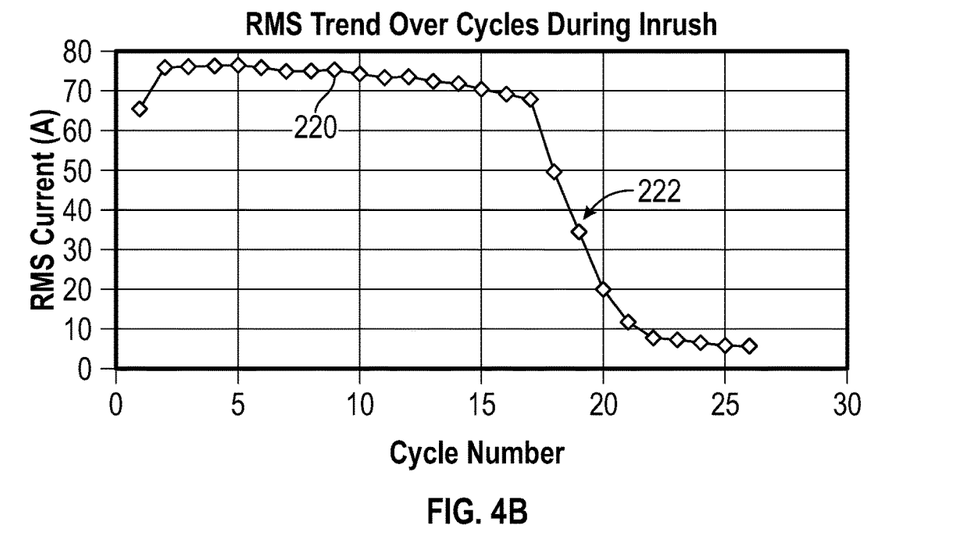

At stage 1, in response to determining that the fault does not include the overlap, the fault classifier 102 is further structured to classify the fault as a short circuit based on a determination that the average current slope or RMS current value has reached respective maximum fault threshold. The maximum fault threshold for RMS current may be, e.g., without limitation, 300 A. At stage 2 or 3, in response to determining that the fault includes the overlap, the fault classifier 102 is further structured to classify the fault as a short circuit or an overload. The physics associated with a short circuit, an overload, or a transient (e.g., an inrush current) are significantly different in terms of first order derivative of time domain sampled current signal, rate of rise, time of event, etc. For example, an inrush current increases for, e.g., without limitation, 2 ms, 200 ms, 500 ms, etc. based on the load and then decreases in the RMS values to the nominal current level of the load as shown in FIGS. 4A-B. In contrast, the fault current does not decrease. Table 1 below illustrates times required for reaching corresponding events and respective notices to a user.

TABLE 1

| Current Type | Fault detection and Classification time | User action or Notice to User |
|---|---|---|
| Normal | NA | Remotely Opens or Closes Secondary Separable Contacts |
| Overload | Approximately 80 ms | Notice of Overload |
| Inrush | Approximately 160 ms | Notice of Inrush Current |
| Short Circuit (SC) | Low level SC: approximately 50-90 μs | Notice of SC |

TABLE 1-continued

| Current Type | Fault detection and Classification time | User action or Notice to User |
|---|---|---|
| | High level SC: approximately 30-50 μs | |

As shown Table 1 no fault detection and classification are made for normal current, and thus the user can remotely close or open the secondary separable contacts via the cloud server 3. For an overload, the fault detection and classification time may be, e.g., without limitation, approximately 80 ms and the fault detector 1 transmits a notice of an overload. For an inrush current, the fault detection and classification time may be, e.g., without limitation, approximately 160 ms, and the fault detector 1 transmits a notice of an inrush current to the user. For a short circuit, the fault detection and classification time may range, e.g., without limitation, from 50 to 90 us for a low level short circuit and from 30 to 50 us for a high level short circuit. The fault detector 1 transmits a notice of a short circuit to the user.

At stage 2, the fault classifier 102 is further structured to estimate a second period required for fault current to reach a maximum fault threshold (e.g., without limitation, 300 A), start a timer for the second period and determine if fault current has reached the maximum fault threshold or the fault current is below the minimum fault threshold and the interrupt status is high. The second period may include, e.g., without limitation, approximately 1 ms, etc. The fault classifier 102 is further structured to revert to the main circuit protector 101 based on a determination that the fault current is below the minimum fault threshold and the interrupt status is high. Alternatively, the fault classifier 102 is further structured to classify the fault as a short circuit and transmit a trip signal to the actuator based on a determination that the fault current has reached the maximum fault threshold. Alternatively, based on a determination that (i) the fault current has not reached the maximum fault threshold and (ii) the fault current is not below the minimum fault threshold and the interrupt status is not high, the fault classifier 102 is further structured to determine if the timer has expired. Based on a determination that the timer has expired, the fault classifier 102 is further structured to determine if the fault current has reached the maximum fault threshold. Based on a determination that the fault current has reached the maximum fault threshold, the fault classifier 102 is further structured to classify the fault as a short circuit and transmit a trip signal to the actuator.

At stage 3, based on a determination that the fault current has not reached the maximum fault threshold, the fault classifier 102 is further structured to determine if at least one of the RMS current value and the average current slope is within an overload range and satisfies a time condition for an inrush current, the time condition including at least the RMS current value with a decreasing trend that starts upon reaching a third period. The third period may be, e.g., without limitation, approximately 160 ms at which an inrush current may commence a decreasing trend. Based on a determination that at least one of the RMS current value and the average current slope is within the overload range but does not satisfy the time condition, the fault classifier 102 is further structured to classify the fault as an overload and transmit a trip signal to the actuator. Alternatively, based on a determination that at least one of the RMS current value and the average current slope is within the overload range and satisfies the time condition, the fault classifier 102 is further structured to classify the fault current as an inrush current and does not transmit a trip signal.

Each stage is discussed further with reference to the below Table 2.

TABLE 2

| Power Factor | Closing Angle Range | Stage 1 RMS Values | Stage 1 Average Slope | Stage 2 Estimated Time to Reach Max Threshold | Stage 3 Aver. Slope/RMS Values/Time Condition |
|---|---|---|---|---|---|
| 1 | 0-180 | Short Circuit (SC) | No Classification | | No Classification |
| 0.8 | 0-18 | No Classification | SC (Except overlap range) | | SC or Overload (For overlap range) |
| | 18-162 | SC | No Classification | | No Classification |
| | 162-180 | No Classification | SC (Except overlap range) | | SC or Overload (For overlap range) |
| 0.5 | 0-36 | No Classification | SC (Except overlap range) | | SC or Overload (For overlap range) |
| | 36-144 | SC | No Classification | | No Classification |
| | 144-180 | No Classification | SC (Except overlap range) | | SC or Overload (For overlap range) |

As shown in Table 2, the look-up table 110 may categorize a fault having, e.g., without limitation, the power factor of 1, 0.8 and 0.5 as well as closing angles ranging from 0-180°. Specific slope ranges to be considered depend on the closing angle ranges and the power factors estimated in a previous cycle. It will be appreciated that Table 2 is a non-limiting, example look-up table for illustrative purposes only, and thus may change depending on the circumstances and needs.

If the fault power factor is unity and the fault closing angle range is within 0 to 180°, the fault does not include an overlap between current signatures of a short circuit, an overload and an inrush current. Thus, the fault classifier 102 may classify the fault based on the RMS values at stage 1. In order to obtain the RMS values, the fault classifier 102 may collect a plurality of samples (e.g., without limitation, 15 current samples at every 1 μs) and estimate the RMS values from 3 averages of 5 samples each, using Mann and Morrison algorithm on sample data filtered utilizing a moving average filter. If the RMS values have reached or exceeded respective maximum fault threshold (e.g., without limitation, 300 A), then the fault classifier 102 may classify the fault as a short circuit and transmit a trip signal to the actuator.

If the fault power factor is 0.8 (a non-unity) and the fault closing angle range is within 0-18°, the fault classifier 102 does not classify the fault based on the RMS values at stage 1. If the fault does not include an overlap between current signatures of a short circuit, an overload and an inrush current, then the fault classifier 102 may classify the fault as a short circuit based on a determination that the current slope has reached or exceeded respective maximum fault threshold at stage 1. The maximum fault threshold for the current slope may be obtained from the look-up table 110, which is configurable and continuously updated. If the fault includes the overlap, at stage 2 the fault classifier 102 estimates a second period required for the fault current to reach the maximum fault threshold and start a timer for the second period. The fault classifier 102 then computes a current slope for every current signal ranging from n to (n−1), n being an integer and a point number at which each sample is collected. For example, if 15 samples were collected, the fault classifier 102 measures current slopes for current signal ranging from sample point number 2 to sample point number 1, current signal ranging from sample point number 3 to sample point number 2, and so forth. The fault classifier 102 then may stop the timer if the fault current (i.e., the instantaneous fault current value) falls below the minimum fault threshold or the product of the timer time and a current slope reaches the maximum threshold (e.g., without limitation, 300 A). If the fault current falls below the minimum fault threshold, the fault classifier 102 determines that the fault is a nuisance. If the fault current has reached the maximum fault threshold, the fault classifier 102 classifies the fault as a short circuit. If the fault current neither is below the minimum fault threshold nor has reached the maximum fault threshold and the timer has not expired, at stage 3 the fault classifier 102 may determine if at least one of the RMS current value and the average current slope is within an overload range and satisfies a time condition for an inrush current, the time condition comprising the RMS current value with a decreasing trend that starts upon reaching a third period. The third period may be, e.g., without limitation, 1 ms. Based on a determination that at least one of the RMS current value and the average current slope is within the overload range but does not satisfy the time condition, the fault classifier 102 classifies the fault as an overload and transmit a trip signal to the actuator. Alternatively, based on a determination that at least one of the RMS current value and the average current slope is within an overload range and satisfies a time condition, the fault classifier 102 classifies the fault current as an inrush current and does not transmit a trip signal.

If the fault power factor is 0.8 and the fault closing angle range is within 18 to 162°, the fault does not include an overlap between current signatures of a short circuit, an overload and an inrush current. Thus, the fault classifier 102 may classify the fault based on the RMS values at stage 1.

If the fault power factor is 0.8 and the fault closing angle range is within 162-180°, the fault classifier 102 does not classify the fault based on the RMS values at stage 1. If the fault does not include the overlap, the fault classifier 102 may classify the fault as a short circuit based on a determination that the current slope has reached or exceeded respective maximum fault threshold at stage 1. If the fault includes the overlap, at stage 2 the fault classifier 102 estimates the second period required for the fault current to reach a maximum fault threshold and start a timer for the second period. The fault classifier 102 then computes a current slope for every current signal ranging from n to (n−1), n being an integer and a point number at which each sample is collected. The fault classifier 102 then may stop the timer if the fault current falls below the minimum fault threshold (e.g., without limitation, 40 A) or the product of the timer time and a current slope reaches the maximum threshold (e.g., without limitation, 300 A). If the fault current falls below the minimum fault threshold, the fault classifier 102 determines that the fault is a nuisance. If the fault current has reached the maximum fault threshold, the fault classifier 102 classifies the fault as a short circuit. If the fault current is neither below the minimum fault threshold nor has reached the maximum fault threshold and the timer has not expired, at stage 3 the fault classifier 102 may determine if at least one of the RMS current value and the average current slope is within an overload range and satisfies a time condition for an inrush current, the time condition comprising the RMS current value with a decreasing trend that starts upon reaching the third period. Based on a determination that at least one of the RMS current value and the average current slope is within the overload range but does not satisfy the time condition, the fault classifier 102 classifies the fault as an overload and transmits a trip signal to the actuator. Alternatively, based on a determination that at least one of the RMS current value and the average current slope is within an overload range and satisfies the time condition, the fault classifier 102 classifies the fault as an inrush current and does not transmit a trip signal.

If the fault power factor is 0.5 and the fault closing angle range is within 0 to 36°, the fault classifier 102 does not classify the fault based on the RMS values at stage 1. If the fault does not include an overlap between current signatures of a short circuit, an overload and an inrush current, then the fault classifier 102 may classify the fault as a short circuit based on a determination that the current slope has reached or exceeded respective maximum fault threshold at stage 1. If the fault includes the overlap, at stage 2 the fault classifier 102 estimates the second period required for the fault current to reach a maximum fault threshold and start a timer for the second period. The fault classifier 102 then computes a current slope for every current signal ranging from n to (n−1), n being an integer and a point number at which each sample is collected. The fault classifier 102 then may stop the timer if the fault current falls below the minimum fault threshold (e.g., without limitation, 40 A) or the product of the timer time and a current slope reaches the maximum threshold (e.g., without limitation, 300 A). If the fault current falls below the minimum fault threshold, the fault classifier 102 determines that the fault is a nuisance. If the fault current has reached the maximum fault threshold, the fault classifier 102 classifies the fault as a short circuit. If the fault current is neither below the minimum fault threshold nor has reached the maximum fault threshold and the timer has not expired, at stage 3 the fault classifier 102 may determine if at least one of the RMS current value and the average current slope is within an overload range and satisfies a time condition for an inrush current, the time condition comprising the RMS current value with a decreasing trend that starts upon reaching the third period. Based on a determination that at least one of the RMS current value and the average current slope is within the overload range but does not satisfy the time condition, the fault classifier 102 classifies the fault as an overload and transmits a trip signal to the actuator. Alternatively, based on a determination that at least one of the RMS current value and the average current slope is within an overload range and satisfies the time condition, the fault classifier 102 classifies the fault as an inrush current and does not transmit a trip signal.

If the fault power factor is 0.5 and the fault closing angle range is within 36 to 144°, the fault does not include an overlap between current signatures of a short circuit, an overload and an inrush current. Thus, the fault classifier 102 may classify the fault based on the RMS values at stage 1.

If the fault power factor is 0.5 and the fault closing angle range is within 144-180°, the fault classifier 102 does not classify the fault based on the RMS values at stage 1. If the fault does not include an overlap between current signatures of a short circuit, an overload and an inrush current, then the fault classifier 102 may classify the fault as a short circuit based on a determination that the current slope has reached or exceeded respective maximum fault threshold at stage 1. If the fault includes the overlap, at stage 2 the fault classifier 102 estimates the second period required for the fault current to reach a maximum fault threshold and start a timer for the second period. The fault classifier 102 then computes a current slope for every current signal ranging from n to (n−1), n being an integer and a point number at which each sample is collected. The fault classifier 102 then may stop the timer if the fault current falls below the minimum fault threshold (e.g., without limitation, 40 A) or the product of the timer time and a current slope reaches the maximum threshold (e.g., without limitation, 300 A). If the fault current falls below the minimum fault threshold, the fault classifier 102 determines that the fault is a nuisance. If the fault current has reached the maximum fault threshold, the fault classifier 102 classifies the fault as a short circuit. If the fault current is neither below the minimum fault threshold nor has reached the maximum fault threshold and the timer has not expired, at stage 3 the fault classifier 102 may determine if at least one of the RMS current value and the average current slope is within an overload range and satisfies a time condition for an inrush current, the time condition comprising the RMS current value without a decreasing trend upon reaching the third period. Based on a determination that neither the RMS current value nor the average current slope is within the overload range and satisfies the time condition, the fault classifier 102 classifies the fault as an overload and transmit a trip signal to the actuator. Alternatively, based on a determination that at least one of the RMS current value and the average current slope is within an overload range and satisfies the time condition, the fault classifier 102 classifies the fault as an inrush current and does not transmit a trip signal.

Therefore, the fault detector 1 may detect and classify a short circuit within tens of microseconds (e.g., without limitation, 50 μs) such that it does not require extensive processing powers required by a circuit protection mechanism that detects and clears a short circuit in milliseconds. Further, the fault detector 1 is compatible with any gateway device as a result of using the moving average filter and the 3-sample algorithm. Further, the fault detector 1 may transmit a message to the user device, the message including at least a notice of the detected and classified fault and the circuit interrupter 10 is capable of being remotely controlled by the user device 5 via the cloud server 3 based at least in part on the notice, thereby increasing convenience and efficiency.

In some examples, the fault detector 1 may include the fault classifier 102, but not the main circuit protector 101. In those examples, the controller 100 may include the main circuit protector 101 as a separate component coupled to the fault detector 1. The fault detector 1 may be disposed within the controller 100, external to the controller 100 but within the circuit interrupter 10, in the cloud server 3, or at any other appropriate locations without departing from the scope of the disclosed concept. In the examples including the fault detector 1 within the cloud server 3, the controller 100 may record the electrical signals and in case of a fault, the fault detector 1 can run remotely through cloud server 3. During a normal condition, a command can be sent by a user to remotely close or open secondary contacts 300 (as shown in FIG. 3). In an event of fault, messages 7 may be transmitted to the user with information including at least the classification of the detected fault.

FIG. 2 is a block diagram of the circuit interrupter 10 of FIG. 1 in accordance with a non-limiting, example embodiment of the disclosed concept. The circuit interrupter 10 may be, without limitation, a smart circuit breaker remotely controllable by a user. It is connected to a power supply 2, e.g., without limitation, utility, via the line conductor 12 and downstream loads 18 via the load conductor 14. In FIG. 2, the circuit interrupter 10 is illustrated in further detail and has a sensor 200 (e.g., without limitation, Rogowski coils) coupled to a threshold detector 250 structured to determine if the rate (di/dt) of rise in current or a current slope has reached or exceeded a minimum fault threshold and transmit a signal indicative of such determination to the controller 100. Based on the data received from the sensor 200 and the determination from the threshold detector 250, the fault detector 1 is structured to detect and classify a fault. Upon detection and classification, the fault detector 1 is further structured to transmit a trip signal to an actuator to open the separable contacts 300. The separable contacts 300 may be remotely opened or closed by a user via the communication module 400 and the user device 5.

FIG. 3 is a partial schematic and block diagram of the circuit interrupter 10 of FIGS. 1 and 2 in accordance with a non-limiting, example embodiment of the disclosed concept. The circuit interrupter 10 is structured to be electrically connected between a power source (not shown) via line conductors 12 and a load(s) 18 via load conductors 14. The circuit interrupter 10 is also coupled to neutral conductors 16 to complete a circuit loop. The circuit interrupter 10 is structured to trip open or switch open to interrupt current flowing to the load 18, for example, in the case of a fault condition (e.g., without limitation, a short circuit, an overload, etc.) to protect the load 18, circuitry associated with the load 18, as well as the components within the circuit interrupter 10. While FIG. 3 shows a 3-phase circuit interrupter 10, it will be appreciated that a single phase circuit breaker or any other multi-phase circuit interrupter may be employed without departing from the scope of the disclosed concept.

The circuit interrupter 10 includes a controller 100, a sensor 200, a threshold detector 250, secondary separable contacts 300, an actuator circuit 310, primary separable contacts 350, an operating mechanism 360, a trip unit 370 and a communications module 400. The operating mechanism 360 is structured to physically open and close the primary separable contacts 350. The trip unit 370 may be a thermal magnetic trip unit or an electronic trip unit structured to control the operating mechanism 360 to open the primary separable contacts 350 upon detection of a fault. The electronic trip unit 370 may include a controller (not shown) structured to monitor for faults based on power flowing through the circuit interrupter 10 and output a trip signal to the operating mechanism 360. While FIG. 3 shows that the sensor 200 includes Rogowski coils, this is for illustrative purposes only, and thus may include other sensors such as voltage sensors, motion sensors, thermal sensors, current transformers, etc. The Rogowski coil 210 is structured to monitor a rate of rise of current (di/dt). At any event in time, when this rate exceeds predetermined thresholds for respective faults, high frequency data sampling is enabled and the fault detector 1 starts to operate. The controller 100 includes a fault detector 1 and a look-up table 110. While in FIG. 3 the fault detector 1 includes a main circuit protector 101 and a fault classifier 102, this is for illustrative purposes only and the main circuit protector 101 may be disposed within the controller 100 and external to the fault detector 1. Further, it is to be understood that the fault detector 1 with or without the main circuit protector 101 may be disposed external to the controller 100 but within the circuit interrupter 10, within the cloud server 3 (as shown in FIG. 1), or any other appropriate location without departing from the scope of the disclosed concept. In response to detecting a fault, the fault classifier 102 classifies the fault and causes the primary separable contacts 350 and/or the secondary separable contacts 300 to trip open.

Figure 4C:
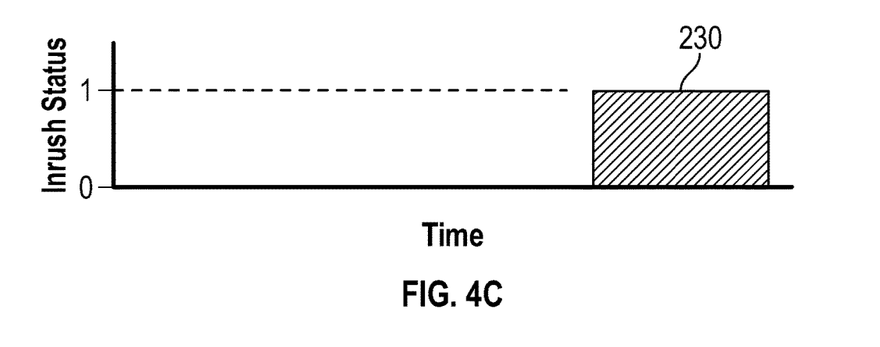

FIGS. 4A-C illustrate graphs depicting an inrush current using the fault detector 1 of FIGS. 1-3 according to a non-limiting, example embodiment of the disclosed concept. FIG. 4A illustrates waveforms of inrush current and voltages. An inrush current is classified based on a decreasing trend 210 occurring over a plurality of cycles. The decreasing trend 210 occurs after the 15$^{th}$ cycle and reduces to the nominal current. FIG. 4B illustrates an RMS trend 220 over the cycles during an inrush current. Waveform 220 shows a decline 222 in the RMS trend after the 15$^{th}$ cycle. FIG. 4C illustrates a classification 230 of an inrush status by the fault detector 1. The inrush status is classified by changing inrush status from zero to one.

Figure 5A:
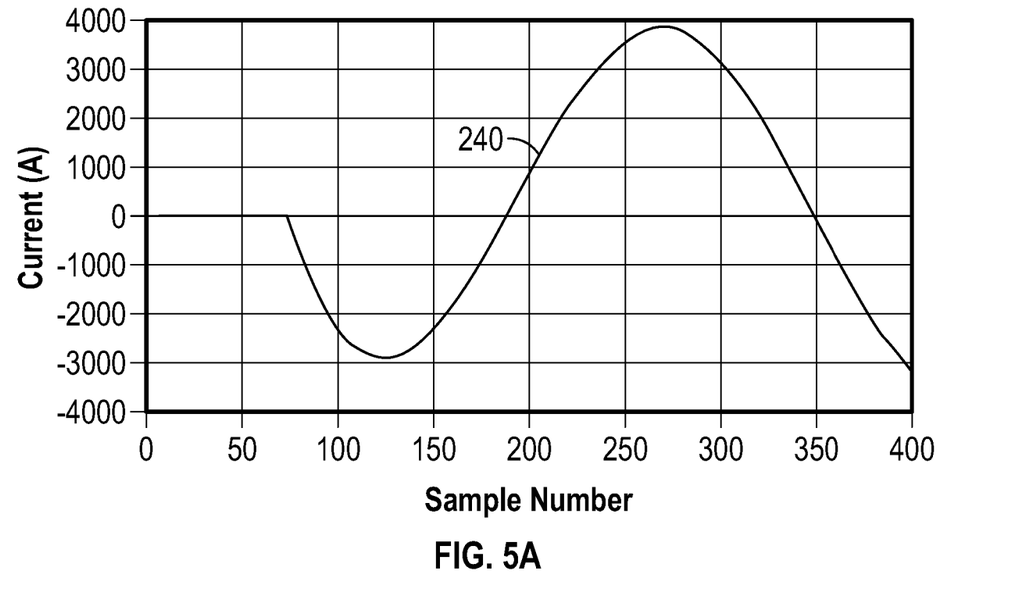
FIGS. 5A-B illustrate graphs of a sample result of a simulated fault event using the fault detector of FIGS. 1-3 according to a non-limiting, example embodiment of the disclosed concept.
Figure 5B:
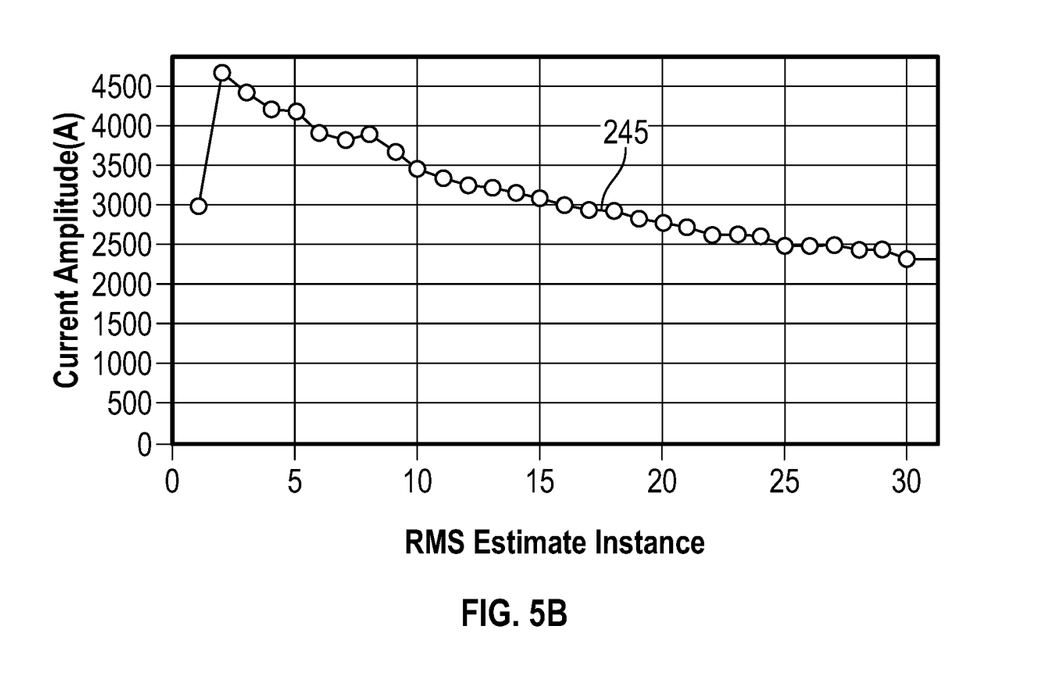

FIGS. 5A-B illustrate graphs 240,245 of a sample result of a simulated fault event using the fault detector 1 of FIGS. 1-3 according to a non-limiting, example embodiment of the disclosed concept. A fault event having a fault level of 2.5 kA and 45° closing angle was created. FIG. 5A illustrates current 240 being sampled at 400 points. FIG. 5B illustrates current amplitude 245 being estimated for RMS values at approximately 30 instances. The sample results showed that once di/dt or current trigger is received, the fault detector 1 detected the fault in less than 50 μs.

Figure 6:
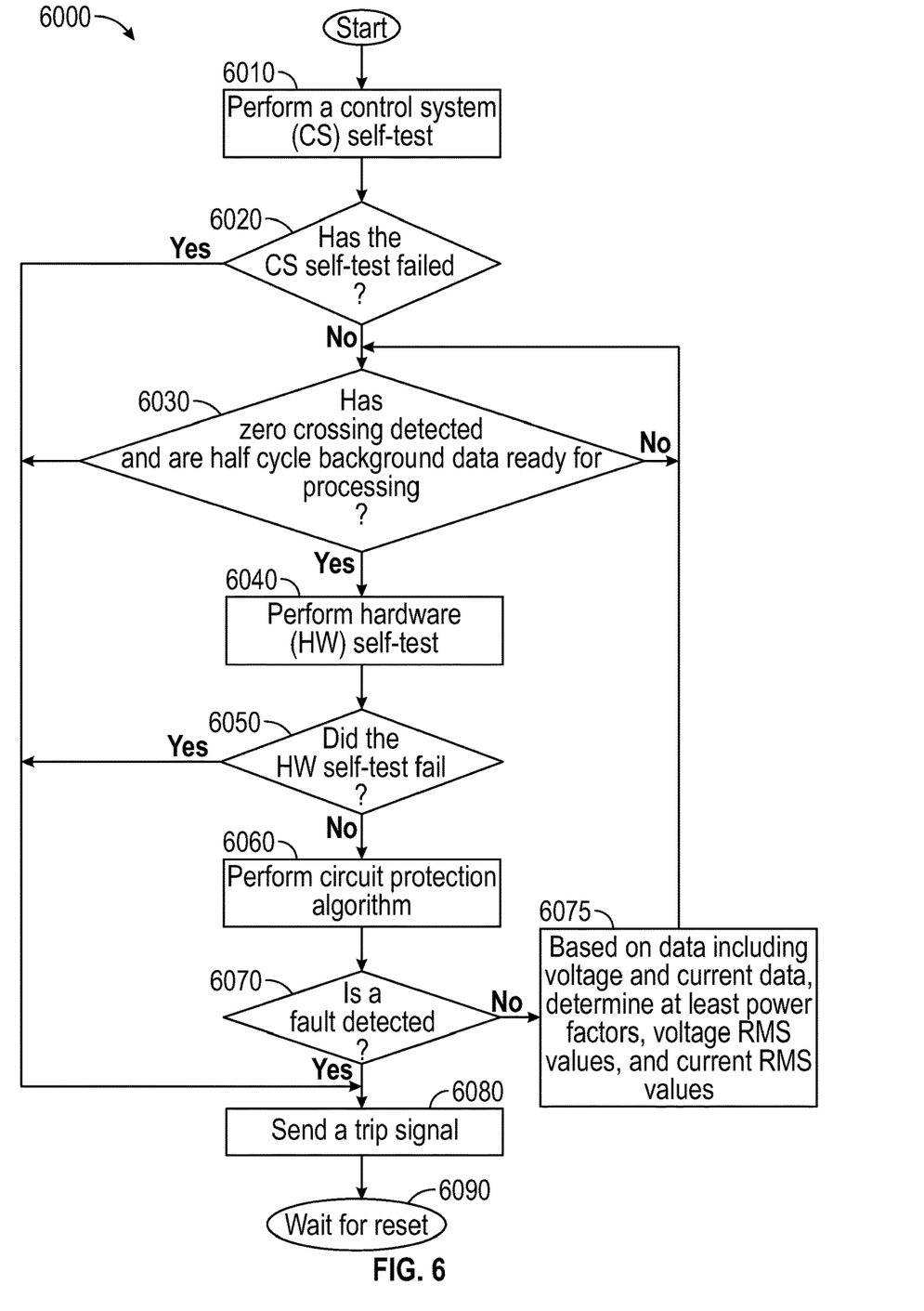
FIG. 6 is a flow chart for a method of circuit protection using a main circuit protector of FIG. 3 in a power distribution system.

FIG. 6 is a flow chart for a method 6000 of circuit protection using the main circuit protector 101 of FIG. 3 according to a non-limiting, example embodiment of the disclosed concept.

At 6010, the main circuit protector performs a control system (CS) self-test. The CS self-test checks if the control system including, e.g., without limitation, processing units and memory, is working properly.

At 6020, the main circuit protector determines if the CS self-test has failed. If yes, the method 6000 proceeds to 6080. If no, the method 6000 proceeds to 6030.

At 6030, the main circuit protector determines if zero-crossing has been detected and half-cycle background data are ready for processing. If no, 6030 is repeated. If yes, the method 6000 proceeds to 6040.

At 6040, the main circuit protector performs a hardware (HW) self-test. The HW self-test determines if all of the hardware components of the circuit interrupter is working properly.

At 6050, the main circuit protector determines if the HW self-test timer has failed. If the HW self-test has failed, the method proceeds to 6080. If the HW self-test has not failed, the method proceeds to 6060.

At 6060, the main circuit protector performs the current protection algorithm, which includes, e.g., without limitation, arc fault protection, ground fault protection, etc.

At 6070, the main circuit protector determines if a fault has been detected. If yes, the method 6000 proceeds to 6080. If no, at 6075 the main circuit protector determines at least power factors, voltage RMS values, and current RMS values based on data including at least previous and/or present voltage and current data collected for background data collection interrupt routine, and the method 6000 returns to 6030. The interrupt routine may execute, e.g., without limitation, 32 times in one AC cycle. The interrupt routine first increments an interrupt count and calculates a closing angle. It then samples ADC (analog to digital converter) data and store current and voltage waveform instantaneous values. Next, ROM, RAM, register check flags and user input from the self-test button are determined every half cycle.

At 6080, the main circuit protector sends a trip signal to actuators of the separable contacts.

At 6090, the main circuit protector waits for reset.

To sum, the method 6000 shows how circuit protection is performed and event parameters are determined for every half cycle in general. That is, when the circuit interrupter is initialized, it will check for the zero-crossings in current and voltage signals and run a self-test (including, e.g., without limitation, the CS and HW self-tests) for the half cycle in order to ensure safe operation of the circuit interrupter. If the self-test fails, the circuit interrupter or the fault detector will generate a trip command. If the self-tests succeeds, the circuit interrupter executes the current protection algorithms such as an arc fault and/or ground fault protection and sends a trip command in the event of a fault. If the circuit interrupter is operating normally, the event parameters including, e.g., without limitation, power factors and RMS values are collected for every half cycle.

Figure 7:
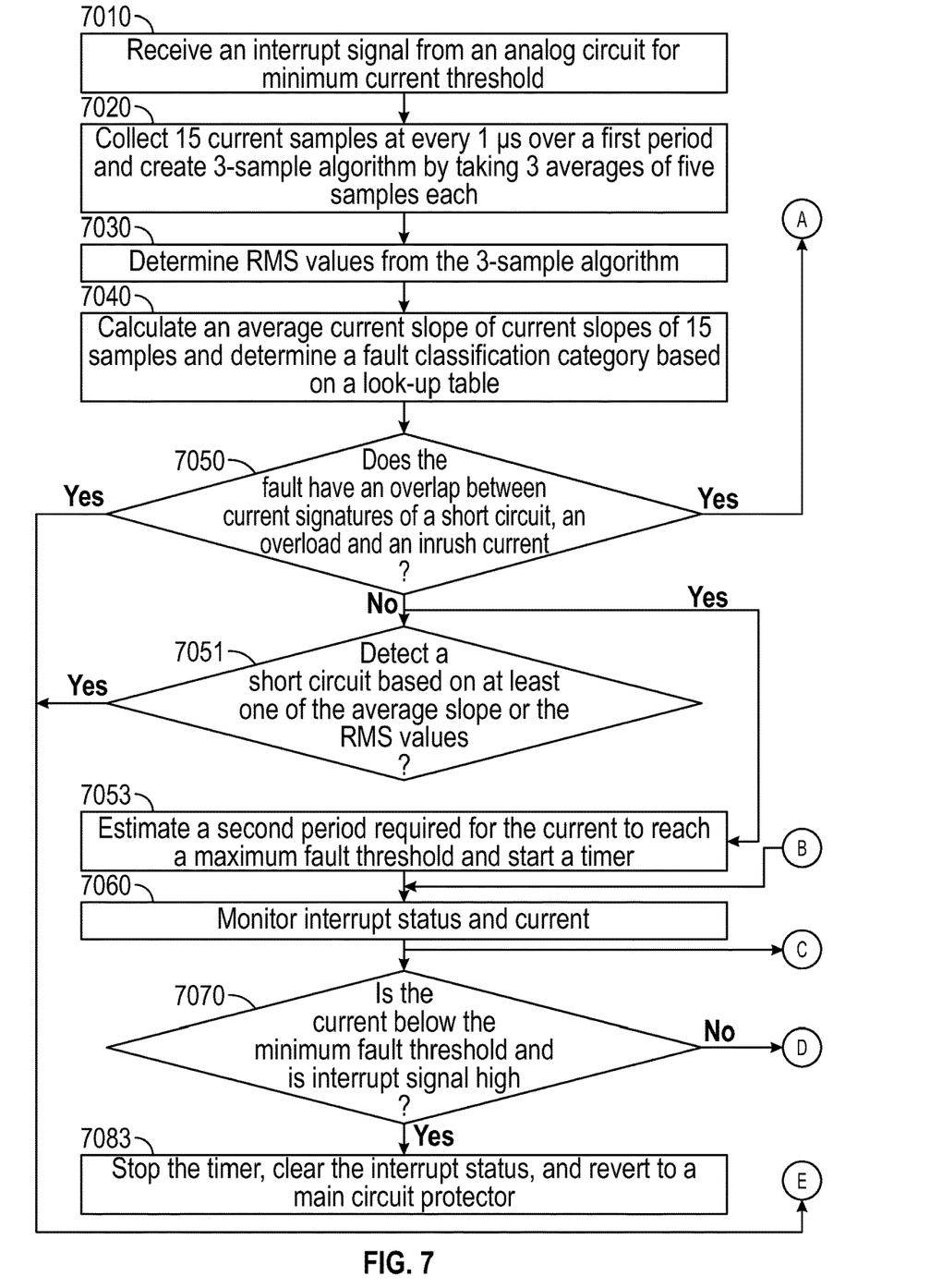
FIG. 7 is a flow chart for a method of detecting a fault in a circuit interrupter using an exemplary fault detector in accordance with an example embodiment of the disclosed concept.

FIG. 7 is a flow chart for a method 7000 of detecting a fault in a power distribution system according to a non-limiting, example embodiment of the disclosed concept. The method 7000 may be performed by the fault classifier 102, the circuit interrupter 10 and/or components thereof as described with reference to FIGS. 1-3. The method 7000 may be used in tandem with the conventional current protection method, e.g., without limitation, the method 6000 of FIG. 6. That is, the main circuit protection is performed by, e.g., without limitation, the main circuit protector 101 until the sensor 200 senses that the di/dr has crossed a minimum fault threshold, triggering the method 7000.

At 7010, the fault detector receives an interrupt signal from an analog circuit for the minimum fault threshold. The analog circuit may be, e.g., without limitation, a threshold detector 250 or other appropriate analog circuit structured to transmit an interrupt signal to the fault detector.

At 7020, the fault detector collects 15 current samples at every 1 μs and creates a 3-sample algorithm by taking 3 averages of five samples each using Mann and Morrison algorithm.

At 7030, the fault detector determines or estimates RMS values (e.g., current and voltage RMS values) from the 3-sample algorithm.

At 7040, the fault detector calculates an average current slope of the current slopes (di/dt) of the 15 samples and determines a fault classification category based at least in part on a look-up table.

At 7050, the fault detector determines if the fault has an overlap between current signatures of a short circuit, an overload and an inrush current. If no, at 7051 the fault classifier determines if a short circuit is detected based on at least one of the average slope or the RMS values and if a short circuit is detected, the method 7000 proceeds to 7100 and if a short circuit is not detected, the method 7000 resumes normal operation. If yes, the method 7000 proceeds to 7053 and 7055. At 7053, the fault classifier estimates a second period required for the current to reach a maximum fault threshold and start a timer. At 7055, the fault classifier determines if at least one of the RMS current value and the average slope is in an overload range and satisfies a time condition for an inrush current. If yes, at 7057 the fault detector classifies the current as an inrush current and does not send a trip signal. If no, at 7059 the fault classifier detects an overload and classifies the fault as an overload. The minimum fault threshold may be, e.g., without limitation, 0.5 A/μs or 40 A integrated current. The maximum fault threshold may be, e.g., without limitation, 300 A integrated current.

At 7060, the fault classifier monitors interrupt status and current, and the method 7000 proceeds to 7070 and 7080.

At 7070, the fault classifier determines if the current is below the minimum fault threshold AND interrupt signal is high. If yes, at 7083 the fault classifier stops the timer, clears the interrupt signal, and revert to the main circuit protector. If no, the method 7000 proceeds to 7090.

At 7080, the fault classifier determines if the current has reached the maximum fault threshold. If yes, the method 7000 proceeds to 7100. If no, the method 7000 proceeds to 7090.

At 7090, the fault classifier determines if the timer has expired. If yes, at 7095 the fault classifier again determines if the current has reached the maximum fault threshold. If yes, the method proceeds to 7100. If no, the method 7000 proceeds to 7055.

At 7100, the fault detector transmits a trip signal.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of disclosed concept which is to be given the full breadth of the claims appended and any and all equivalents thereof.

What is claimed is:

1. A circuit interrupter structured to electrically connect between a power source and a load, the circuit interrupter comprising:
    separable contacts;
    an actuator coupled to the separable contacts and structured to open the separable contacts to interrupt current from flowing to the load upon detection of a fault;
    a current sensor structured to sense current flowing through the circuit interrupter to the load;
    a communication module structured to be communicatively coupled to at least one of a cloud server and a user device and structured to transmit and receive data; and
    a controller coupled to the sensor, the actuator, and the communication module, the controller comprising at least one of a fault detector and a look-up table, the fault detector structured to detect and classify a fault based at least in part on a signal from the sensor, the look-up table comprising at least reference data associated with previous normal cycles, the reference data including at least power factors, closing angle ranges and fault classification categories.

2. The circuit interrupter of claim 1, wherein the fault detector comprises a main circuit protector and a fault classifier, the main circuit protector being structured to execute self-tests, perform circuit protection upon detecting at least one of an arc fault and ground fault, collect and store the reference data, the fault classifier being structured to be triggered upon detecting a fault, the detecting comprising sensing by the sensor that a current slope (di/dt) has reached or exceeded a minimum fault threshold.

3. The circuit interrupter of claim 2, wherein for classifying the fault, the fault classifier is further structured to collect a plurality of samples over a first period upon being triggered, filter sample data of the plurality of samples using a moving average, determine root mean square (RMS) values for voltage and current using a 3-sample algorithm on filtered sample data, calculate an average current slope of the plurality of samples over the first period, and determine a fault classification category for the detected fault.

4. The circuit interrupter of claim 3, wherein for determining a fault classification category, the fault classifier is further structured to determine a fault power factor from a previous cycle and a fault closing angle based on the triggering of the fault classifier and filtered sample data and select a fault classification category; and wherein for selecting a fault classification category, the fault classifier is further structured to determine if the fault includes an overlap between current signatures of a short circuit, an overload and an inrush current.

5. The circuit interrupter of claim 4, wherein in response to determining that the fault does not include the overlap, the fault classifier is further structured to classify the fault as a short circuit based on a determination that the average current slope or RMS current value has reached respective maximum fault threshold; or wherein in response to determining that the fault includes the overlap, the fault classifier is further structured to classify the fault as a short circuit or an overload.

6. The circuit interrupter of claim 5, wherein for classifying the fault as a short circuit or an overload, the fault classifier is further structured to estimate a second period required for fault current to reach a maximum fault threshold, start a timer for the second period and determine if the fault current has reached the maximum fault threshold or the fault current is below the minimum fault threshold and the interrupt status is high.

7. The circuit interrupter of claim 6, wherein the fault classifier is further structured to revert to the main circuit protector based on a determination that the fault current is below the minimum fault threshold and the interrupt status is high;
wherein the fault classifier is further structured to classify the fault as a short circuit and transmit a trip signal to the actuator based on a determination that the fault current has reached the maximum fault threshold; or
wherein based on a determination that (i) the fault current has not reached the maximum fault threshold and (ii) the fault current is not below the minimum fault threshold and the interrupt status is not high, the fault classifier is further structured to determine if the timer has expired.

8. The circuit interrupter of claim 7, wherein based on a determination that the timer has expired, the fault classifier is further structured to determine if the fault current has reached the maximum fault threshold; and
wherein based on a determination that the fault current has reached the maximum fault threshold, the fault classifier is further structured to classify the fault as a short circuit and transmit a trip signal to the actuator, or
wherein based on a determination that the fault current has not reached the maximum fault threshold, the fault classifier is further structured to determine if at least one of the RMS current value and the average current slope is within an overload range and satisfies a time condition for an inrush current, the time condition comprising the RMS current value with a decreasing trend that starts upon reaching a third period.

9. The circuit interrupter of claim 8, wherein based on a determination that at least one of the RMS current value and the average current slope is within the overload range but does not satisfy the time condition, the fault classifier is further structured to classify the fault as an overload and transmit a trip signal to the actuator, or
wherein based on a determination that at least one of the RMS current value and the average current slope is within the overload range and satisfies the time condition, the fault classifier is further structured to classify the fault as an inrush current and does not transmit a trip signal.

10. The circuit interrupter of claim 8, wherein the first period comprises approximately 15 μs, the second period comprises approximately 1 ms, and the third period comprises approximately 160 ms.

11. The circuit interrupter of claim 1, wherein the fault detector detects and classifies a short circuit within tens of microseconds such that it does not require extensive processing powers required by a circuit protection mechanism that detects and clears a short circuit in milliseconds and is compatible with a gateway device.

12. The circuit interrupter of claim 1, wherein the fault detector is further structured to transmit a message to the user device, the message including at least a notice of the detected and classified fault and wherein the circuit interrupter is capable of being remotely controlled by the user device via the cloud server based at least in part on the notice.

13. A method of detecting and classifying a fault in microseconds, comprising:
providing a circuit interrupter that is structured to electrically connect between a power source and a load and comprises: separable contacts, an actuator coupled to the separable contacts and structured to open or close the separable contacts, a current sensor structured to sense current flowing through the circuit interrupter to the load, a communication module communicatively coupled to at least one of a cloud server and a user device and structured to transmit and receive data; and a controller coupled to the sensor, the actuator, and communication module, the controller comprising at least one of a fault detector and a look-up table, the fault detector comprising a main circuit protector and a fault classifier, the look-up table comprising at least reference data associated with previous normal cycles, the reference data including at least power factors, closing angle ranges and fault classification categories;
sensing at least the current flowing through the circuit interrupter to the load; and
detecting and classifying a fault based at least in part on a signal from the sensor.

14. The method of claim 13, wherein the detecting and classifying a fault comprises:
executing self-tests, performing circuit protection upon detecting at least one of an arc fault and ground fault, collecting and storing the reference data;
triggering the fault classifier upon detecting a fault, the detecting comprising sensing by the sensor that a current slope (di/dt) has reached or exceeded a minimum fault threshold;
collecting, by the fault classifier, a plurality of samples over a first period;
filtering, by the fault classifier, sample data of the plurality of samples using a moving average;
determining, by the fault classifier, root mean square (RMS) values for voltage and current using a 3-sample algorithm on filtered sample data;
calculating, by the fault classifier, an average current slope of the plurality of samples over the first period; and
determining, by the fault classifier, a fault classification category for detected fault.

15. The method of claim 14, wherein the determining a fault classification category comprises:
determining a fault power factor from a previous cycle and a fault closing angle based on the triggering of the fault classifier and the filtered sample data;
selecting a fault classification category based at least in part on the reference data of the look-up table.

16. The method of claim 15, wherein the selecting a fault classification category comprises:
    determining if the fault includes an overlap between current signatures of a short circuit, an overload and a transient based at least in part on the fault power factor, the fault closing angle and the reference data of the look-up table; and
    in response to determining that the fault does not include the overlap, classifying the fault as a short circuit based on a determination that the average current slope or RMS current value has reached respective maximum fault threshold, and classifying the fault as a short circuit, or
    in response to determining that the fault includes the overlap, classifying the fault as a short circuit or an overload.

17. The method of claim 16, wherein the classifying the fault as a short circuit or an overload comprises:
    estimating a second period required to reach a maximum fault threshold;
    starting a timer for the second period; and
    determining if the fault current has reached a maximum fault threshold, or the fault current is below the minimum fault threshold and the interrupt status is high.

18. The method of claim 17, further comprising:
    in response to determining that the fault current is below the minimum fault threshold and the interrupt status is high, reverting to the main circuit protector;
    in response to determining that the fault current has reached the maximum fault threshold, classifying the fault as a short circuit and transmitting a trip signal to the actuator; or
    in response to determining that (i) the fault current has not reached the maximum fault threshold and (ii) the fault current is not below the minimum fault threshold and the interrupt status is not high, determining if the timer has expired.

19. The method of claim 18, further comprising:
    in response to determining that the timer has expired, determining if the fault current has reached the maximum fault threshold; and
    in response to determining that the fault current has reached the maximum fault threshold, classifying the fault as a short circuit and transmitting a trip signal to the actuator, or
    in response to determining that the fault current has not reached the maximum fault threshold, determining if at least one of the RMS current value and the average current slope is within an overload range and satisfies a time condition for an inrush current.

20. The method of claim 19, further comprising:
    in response to determining that at least one of the RMS current value and the average current slope is within an overload range but does not satisfy the time condition, classifying the fault as an overload and transmitting a trip signal to the actuator, or
    in response to determining that at least one of the RMS current value and the average current slope is within an overload range and satisfies the time condition, classifying the fault current as an inrush current.

\* \* \* \* \*